(12) United States Patent
Kawabata et al.

(10) Patent No.: US 9,484,341 B2
(45) Date of Patent: Nov. 1, 2016

(54) MOM CAPACITOR CIRCUIT AND SEMICONDUCTOR DEVICE THEREOF

(71) Applicant: Powerchip Technology Corporation, Hsinchu (TW)

(72) Inventors: Shozo Kawabata, Tokyo (JP); Nobuhiko Ito, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/918,600

(22) Filed: Oct. 21, 2015

(65) Prior Publication Data

US 2016/0260706 A1    Sep. 8, 2016

(30) Foreign Application Priority Data

Mar. 3, 2015    (JP) .................................. 2015-041387

(51) Int. Cl.
| H01L 27/00 | (2006.01) |
| H01L 49/02 | (2006.01) |
| H01L 27/06 | (2006.01) |
| H01L 27/02 | (2006.01) |

(52) U.S. Cl.
CPC ....... H01L 27/0629 (2013.01); H01L 27/0207 (2013.01); H01L 28/60 (2013.01)

(58) Field of Classification Search
CPC ........... H01L 27/0629; H01L 27/0207; H01L 27/06; H01L 27/0727; H01L 28/60; H01L 28/40
See application file for complete search history.

(56) References Cited

U.S. PATENT DOCUMENTS

| 6,741,114 B2 | 5/2004 | Kim |
| 8,614,472 B1 * | 12/2013 | Islam .................. H01L 23/5223 257/301 |
| 8,916,919 B2 * | 12/2014 | Thompson .......... H01L 23/5223 257/307 |
| 2006/0087004 A1 | 4/2006 | Furumiya et al. |
| 2012/0326270 A1 * | 12/2012 | Thompson .......... H01L 23/5223 257/532 |
| 2014/0266408 A1 | 9/2014 | Guimaraes et al. |

FOREIGN PATENT DOCUMENTS

| JP | H09147582 | 6/1997 |
| JP | 2000277691 | 10/2000 |
| JP | 2011228396 | 11/2011 |
| JP | 2014107415 | 6/2014 |

* cited by examiner

*Primary Examiner* — Nikolay Yushin
(74) *Attorney, Agent, or Firm* — Jianq Chyun IP Office

(57) ABSTRACT

A capacitor circuit formed by a plurality of capacitors using metal electrodes formed on a substrate is provided, such that the capacitance of the capacitor can be adjusted with higher precision as compared to the conventional art. The MOM capacitor includes a plurality of MOM (Metal-Oxide-Metal) capacitors respectfully formed by pairs of metal electrodes facing each other through an insulating film on a substrate. The MOM capacitor circuit is formed by at least one capacitor element in a manner that each of the pairs of the metal electrodes of the MOM capacitors is connected to a first terminal and a second terminal through a connecting conductor; and at least one switch element, connected to the plurality of metal electrodes and at least one of the first terminal and the second terminal, wherein a capacitance of the MOM capacitor circuit is adjusted by turning on/off the switch element.

17 Claims, 11 Drawing Sheets

MOM CAPACITOR CIRCUIT AND SEMICONDUCTOR DEVICE THEREOF

CROSS-REFERENCE TO RELATED APPLICATION

This application claims the priority benefit of Japan application serial no. 2015-041387, filed on Mar. 3, 2015. The entirety of the above-mentioned patent application is hereby incorporated by reference herein and made a part of this specification.

BACKGROUND OF THE INVENTION

1. Field of the Invention

The present invention generally relates to a MOM capacitor circuit and a semiconductor device thereof, for example a flash memory such as an electrically rewritable non-volatile semiconductor memory device (EEPROM).

2. Description of Related Art

Conventionally, a plurality of memory cell transistors (hereinafter memory cell) are connected in series between the bit line and the source line to constitute a NAND string, so as to achieve a highly integrated NAND-type non-volatile semiconductor memory device known in the art (for example, refer to Patent Document 1).

FIG. 1 is a block diagram showing the overall configuration of a NAND type flash EEPROM according to the conventional art. FIG. 2 is a circuit diagram showing the configuration of a memory cell array 10 of FIG. 1 and its peripheral circuit.

In FIG. 1, the conventional NAND-type flash EEPROM is configured to include a memory cell array 10, a control circuit 11 for operation control, a row decoder 12, a high voltage generating circuit 13, a page buffer circuit 14 that includes data rewriting and reading circuits, a column decoder 15, a command register 17, an address register 18, an operation logic controller 19, a data input/output buffer 50 and a data input/output terminal 51.

As shown in FIG. 2, the memory cell array 10 can for example be composed of NAND cell units NU (NU0, NU1, . . . ) each of which has 16 electrically rewritable non-volatile memory cells MC0~MC15 with stacked gate structure that are connected in series. In each NAND cell unit NU, the drain side is connected to a bit line BL through a select gate transistor SG1, and the source side is connected to a common source line CELSRC through a select gate transistor SG2. The control gates of the memory cells MC arranged in the row direction are commonly connected to a word line WL, and the gate electrodes of the select gate transistors SG1, SG2 are connected to the select gate lines SGD, SGS that are arranged in parallel with the word line WL. The range of memory cells selected by one word line WL is one page that is the unit for reading and writing. A range of plural NAND cell units NU within one page or its integer multiple range is defined as one block, i.e., the unit for erasing data. The page buffer circuit 14 is used for performing data writing and reading in a page unit, and includes a sense amplifier circuit (SA) and a latch circuit (DL) provided for each bit line.

The memory cell array 10 shown in FIG. 2 has a simplified structure, wherein a plurality of bit lines can shares the page buffer. In this case, the number of bit lines selectively connected to the page buffer during data writing or reading operation will be in a unit of one page. Furthermore, FIG. 2 shows the range of cell array where data input and output is performed with one data input/output terminal 51. In order to perform selection of the word line WL and the bit line BL of the memory cell array 10, the row decoder 12 and the column decoder 15 are provided. The control circuit 11 is used to perform the sequence control for data writing, erasing and reading. The high voltage generating circuit 13, which is controlled by the control circuit 11, will generate a boosted high voltage and intermediate voltage used for data rewriting, erasing and reading.

The data input/output buffer 50 is used to input and output data as well as used to input the address signal. That is, through the data input/output buffer 50 and the data signal line 52, data transfer is performed between the data input/output terminal 51 and the page buffer circuit 14. The address signal that is inputted from the data input/output terminal 51 is maintained in the address register 18, and the signal is sent to the row decoder 12 and the column decoder 15 for decoding. The command for the operation control is also inputted from the data input/output terminal 51. The inputted command is decoded and maintained in the command register 17, and is further used for controlling the control circuit 11. External control signals such as the chip enable signal CEB, the command latch enable CLE, the address latch enable signal ALE, the write enable signal WEB and the read enable signal REB etc. are taken into the operation logic controller 19, wherein the internal control signal is generated according to the operation mode. The internal control signal is used to control the data latch, data transfer in the data input/output buffer 50, and the internal control signal is further sent to the control circuit 11 where the operation control is performed.

The page buffer circuit 14 includes two latch circuits 14$a$ and 14$b$, and is configured to be capable of switching between the multi-value operation function and the cache function. That is, when one memory cell is used to store a 1 bit binary data, the cache function is provided; when one memory cell is used to store a 2 bit four-value data, either to perform the cache function, or to be limited by address, the cache function can be affected.

FIG. 3A a plan view showing an example configuration of a MOM (Metal-Oxide Metal) capacitor according to the conventional example that is generally formed in a large-scale semiconductor integrated circuit (LSI). FIG. 3B is a vertical cross-sectional view along the line A-A' shown in FIG. 3A. In FIG. 3A and FIG. 3B, after forming an oxide film 21 such as a silicon oxide film on a semiconductor substrate 20, the metal electrodes 31~34 of the N$^{th}$ metal layer MLN are formed on the oxide film 21. Furthermore, after forming an oxide film 22, the metal electrodes 35~38 of the N+1$^{th}$ metal layer MLN+1 are formed on the oxide film 22. Additionally, after forming an oxide film 23, the metal electrodes 39~42 of the N+2$^{th}$ metal layer MLN+2 are formed on the oxide film 23. In the manner described above, the capacitor C101 is formed by the pair of metal electrodes 36 and 40 with the oxide film 23 sandwiched therebetween, and the capacitor 102 is formed by the pair of metal electrodes 36 and 37 with the oxide film 23 sandwiched therebetween. In addition a capacitor circuit having such a plurality of MOM capacitors is also formed in a non-volatile memory device such as a NAND type flash memory.

PATENT DOCUMENTS

Patent Document 1: Japanese Laid Open Publication No. H09-147582.
Patent Document 2: Japanese Laid Open Publication No. 2011-228396.

Patent Document 3: Japanese Laid Open Publication No. 2014-107415.

Patent Document 3: US Patent Application Publication No. 2014/0266408.

Patent Document 4: US Patent Application Publication No. 2006/0087004.

SUMMARY OF THE INVENTION

The advantages of the above MOM capacitor is that the capacitance is fixed, meaning that the capacitance does not change according to the bias voltage. Furthermore, it is easy to connect a plurality of MOM capacitors in series, and the voltage durability can also be easily increased. In contrast, for MOS (Metal-Oxide-Silicon) capacitors, since one of the electrodes is formed on the semiconductor substrate or well, it would be relatively difficult to connect the capacitors in series. Further, high voltage MOS capacitor has a relatively low capacitance, hence will have the problem where the capacitance changes with the bias voltage.

Next, the need to adjust the capacitance of the capacitor in a semiconductor device will be described below.

FIG. 4A is a circuit diagram showing the configuration of an RC delay circuit according to the conventional example. In FIG. 4A, the RC delay circuit includes inverters 101 and 102, a resistor R101 and a capacitor C101. For example, a delay amount is adjusted by changing the capacitance of the capacitor C101.

FIG. 4B is a circuit diagram showing the configuration of a voltage-divider capacitor circuit according to the conventional example. In FIG. 4B, the voltage-divider capacitor circuit is configured to include capacitors C111~C113, C121~C123, and transfer gates TG101~TG103. By turning on/off connections between the capacitors C121~C123 (that are respectively connected to the transfer gates TG101~103) and an input voltage inputted to terminal T1, the output voltage outputted from the terminal T2 can be varied.

FIG. 4C is a circuit diagram showing the configuration of a charge transfer type DA converter circuit according to the conventional example. In FIG. 4C, the charge transfer type DA converter circuit includes a differential amplifier A1, capacitors C131~C134, and switches SW0~SW4 that are respectively controlled to be turned on/off by control signals φ0~φ4. The output voltage outputted from the terminal T2 can be varied by turning on/off the switches SW1~SW4 according to input data.

As described above, in many applications, the capacitance of the capacitor is changed or adjusted so as to obtain a predetermined correct physical quantity. In the method according to the conventional art, by using a MOS capacitor or a MIM (Metal-Insulator-Metal) capacitor, for example, although N unit capacitors can be constructed, however, to accurately adjust the capacitance of each capacitor is still a difficult problem due to the process variation.

An object of the present invention is to provide a MOM capacitor circuit and a semiconductor device. For such capacitor circuit the metal electrodes formed on the substrate of the semiconductor device are used to form a plurality of capacitors, the capacitance of the capacitor can be adjusted with higher precision as compared to the conventional art.

For a MOM capacitor in the first embodiment of the invention, the MOM capacitor comprises a plurality of MOM (Metal-Oxide-Metal) capacitors respectively formed by a plurality of pairs of metal electrodes facing each other through an insulating film on a substrate, wherein the MOM capacitor circuit is formed by at least one capacitor element in a manner that the each of the pairs of the metal electrodes of the plurality of MOM capacitors is connected to a first terminal and a second terminal through a connecting conductor; and one or more switch elements, connected to the plurality of metal electrodes and at least one of the first terminal and the second terminal, wherein a capacitance of the MOM capacitor circuit is adjusted by turning on or off the switch element.

For the MOM capacitor circuit in an embodiment of the invention, the plurality of metal electrodes are arranged in a grid shape in a cross section of multiple layers on the substrate.

For the MOM capacitor circuit in an embodiment of the invention, the MOM capacitor circuit includes an adjustment capacitance portion with a variable capacitance, wherein the adjustment capacitance portion has a plurality of first metal electrodes, and at least one part of the plurality of the first metal electrode is connected to either the first terminal or the second terminal through each of the switch elements.

For the MOM capacitor circuit in an embodiment of the invention, the MOM capacitor circuit includes a fixed capacitance portion with a fixed capacitance, wherein the fixed capacitance portion has a plurality of second metal electrodes, and the plurality of the second metal electrodes are connected to either the first terminal or the second terminal.

For the MOM capacitor circuit in an embodiment of the invention, at least one part of the plurality of the first metal electrodes of the adjustment capacitance portion is connected to the first terminal through each of the switch elements.

For the MOM capacitor circuit in an embodiment of the invention, when each of the switch elements is turned off, metal electrodes connected to each of the switch elements are in a floating state.

For the MOM capacitor circuit in an embodiment of the invention, at least one part of the plurality of first metal electrodes of the adjustment capacitance portion is connected to the first terminal through a first switch element and connected to the second terminal through a second switch element.

For the MOM capacitor circuit in an embodiment of the invention, when both of the first switch element and the second switch element are turned off, metal electrodes connected to the first switch element and the second switch element are in a floating state.

For the MOM capacitor circuit in an embodiment of the invention, at least one part of the plurality of the first metal electrodes of the adjustment capacitance portion is connected to the first terminal through a first switch element; and at least another part other than the at least one part of the plurality of the first metal electrodes of the adjustment capacitance portion is connected to the second terminal through a second switch element.

For the MOM capacitor circuit in an embodiment of the invention, when the first switch element or the second switch element is turned off, a metal electrode connected to the first switch element or the second switch element is in a floating state.

For the MOM capacitor circuit in an embodiment of the invention, the adjustment capacitance portion includes a rough adjustment capacitance portion, wherein a plurality of metal electrodes that belongs to the at least one part of the plurality of first metal electrode of the adjustment capacitance portion is connected to one another, and connected to the first terminal through a first switch element and connected to the second terminal through a second switch element; and includes a fine adjustment capacitance portion, wherein metal electrodes other than the at least one part of the plurality of the first metal electrodes of the adjustment capacitance portion are respectively connected to the first terminal through a third switch element and connected to the second terminal through a fourth switch element.

For the MOM capacitor circuit in an embodiment of the invention, when both of the first switch element and the second switch element are turned off, metal electrodes connected to the first switch element and the second switch element are in a floating state.

A semiconductor device in an embodiment of the invention, including the MOM capacitor circuit as described above.

According to the capacitor circuit in a semiconductor device of the invention, a plurality of metal electrodes formed on the substrate of the semiconductor device is used to form a plurality of capacitors. As such, the capacitance of the capacitor can be adjusted with higher precision as compared to the related art.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7A is a plan view of the metal layer M4, FIG. 7B is a plan view of the metal layer M3, FIG. 7C is a plan view of the metal layer M2, FIG. 7D is a schematic plan view of the metal layer M1 and the MOS transistors Q1~Q5.

DESCRIPTION OF THE EMBODIMENTS

Figure 1:
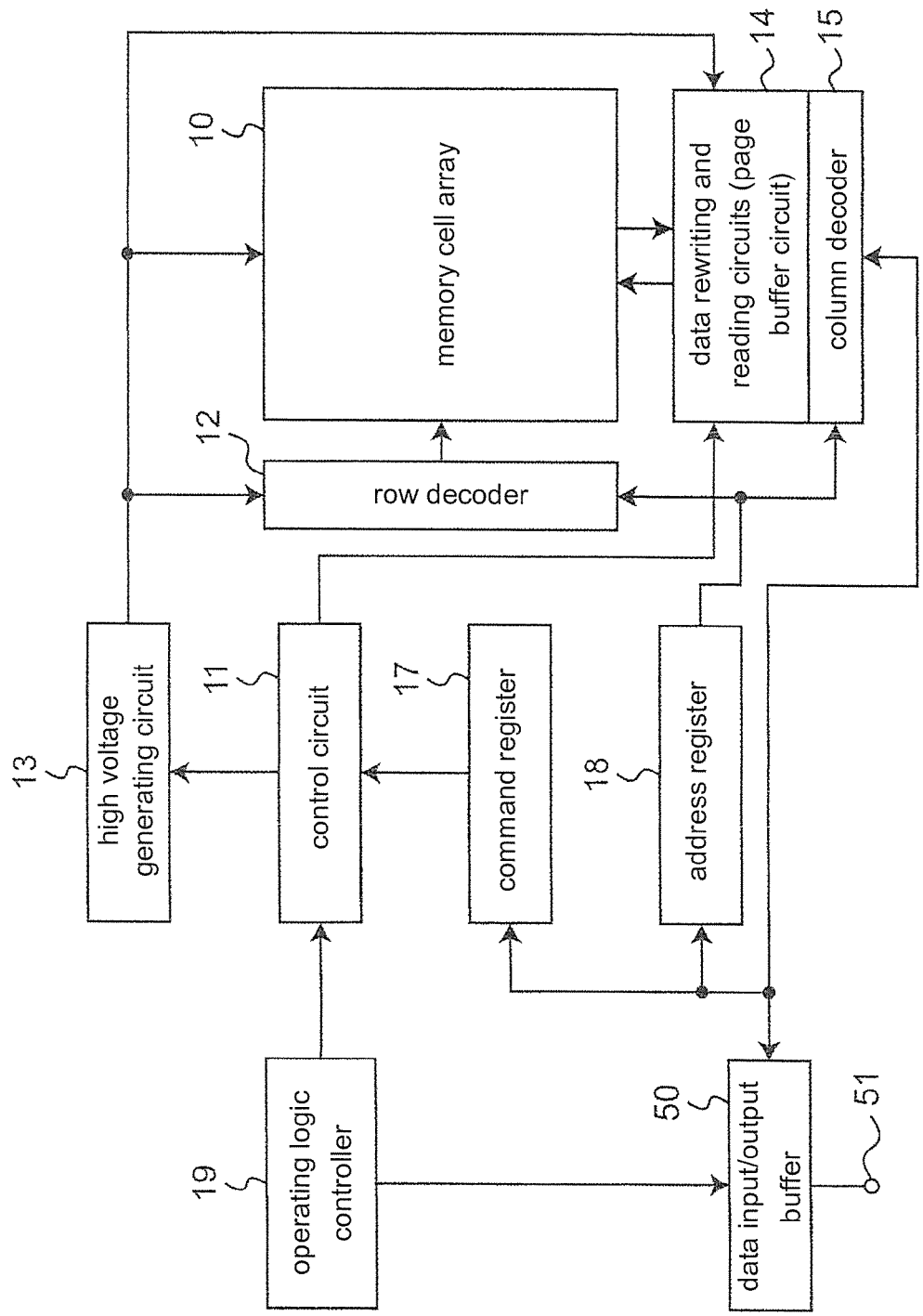
FIG. 1 is a block diagram showing the overall configuration of a NAND type flash EEPROM according to the conventional art.
Figure 2:
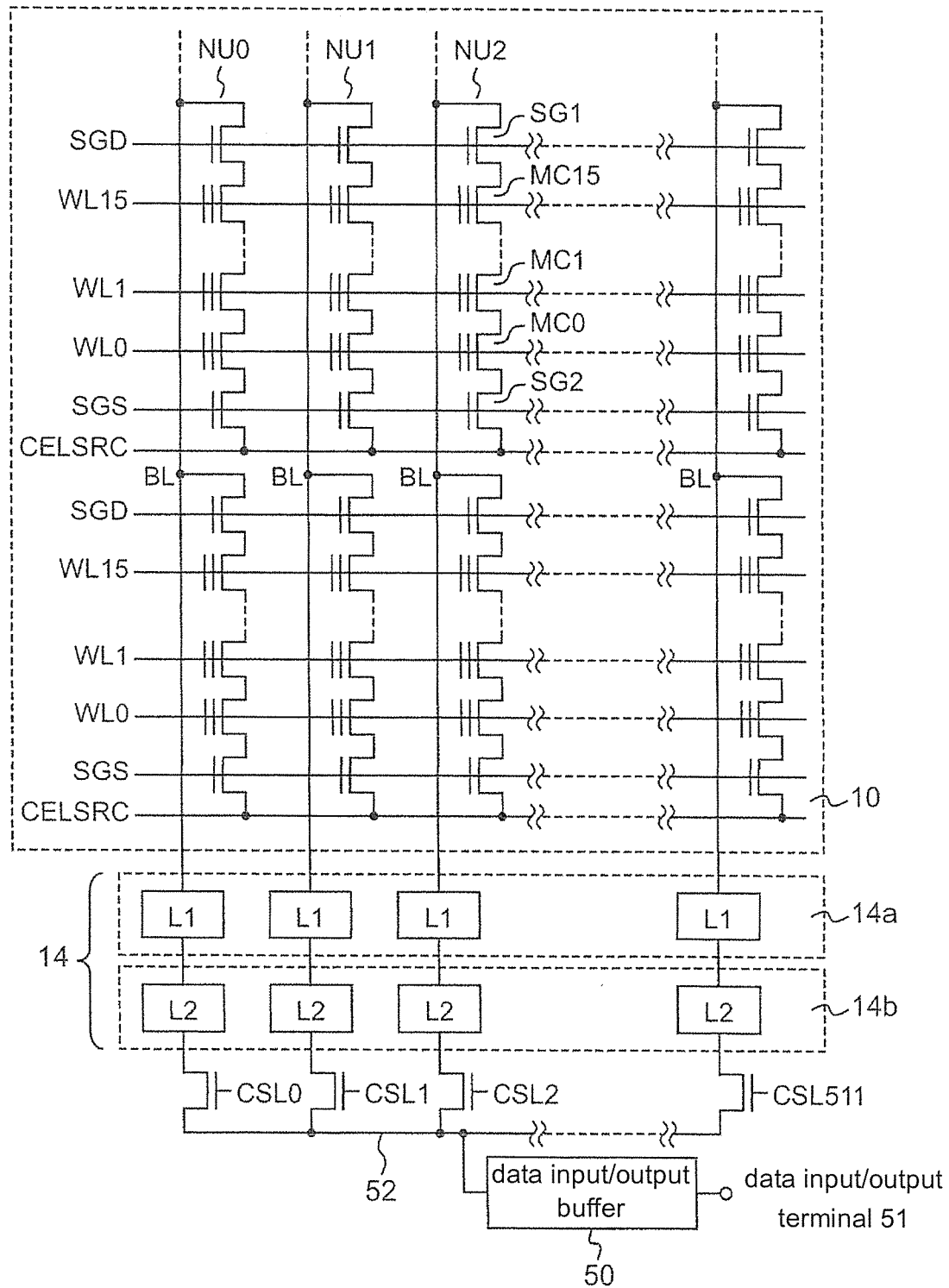
FIG. 2 is a circuit diagram showing a memory cell array 10 of FIG. 1 and its peripheral circuit.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 3A:
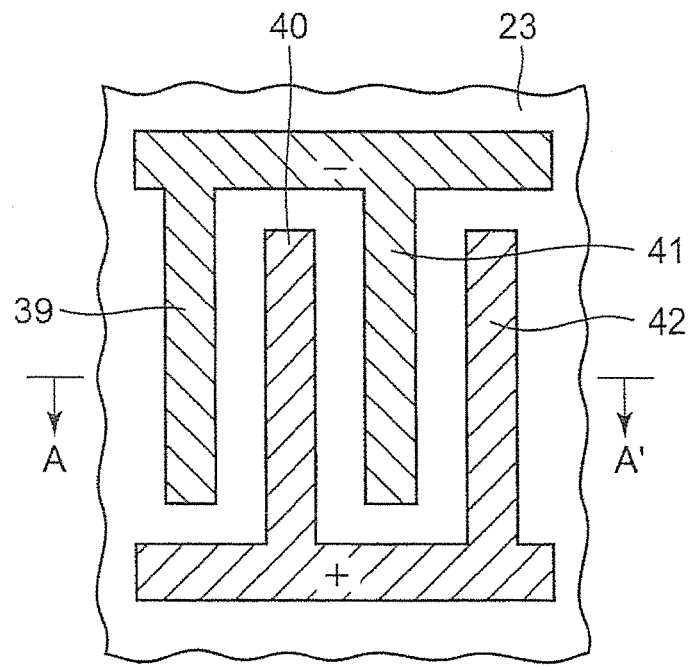
FIG. 3A is a plan view showing the configuration of a MOM (Metal-Oxide-Metal) capacitor according to the conventional example.
Figure 3B:
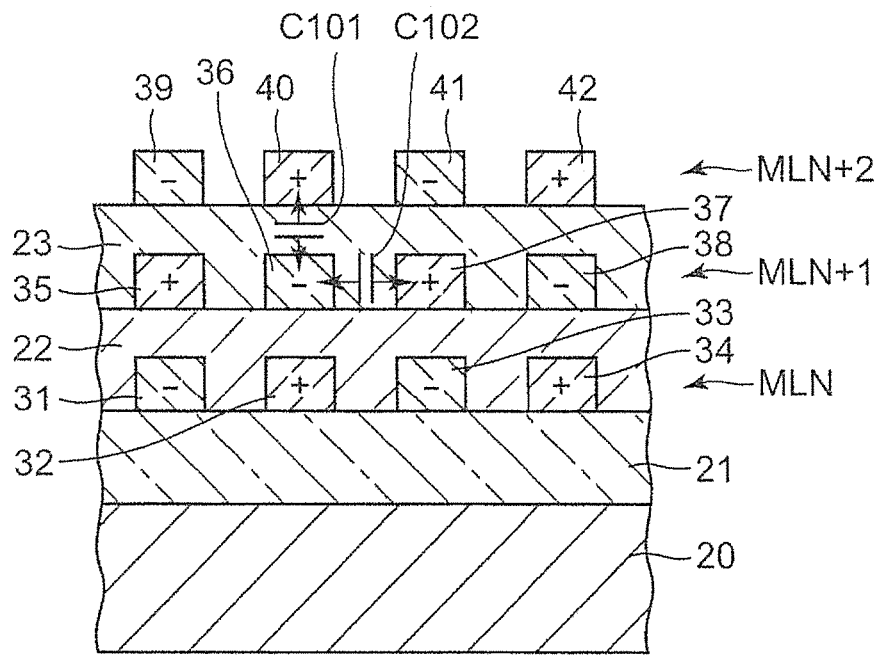
FIG. 3B is a vertical cross-sectional view along the line A-A' in FIG. 3A.
Figure 4A:
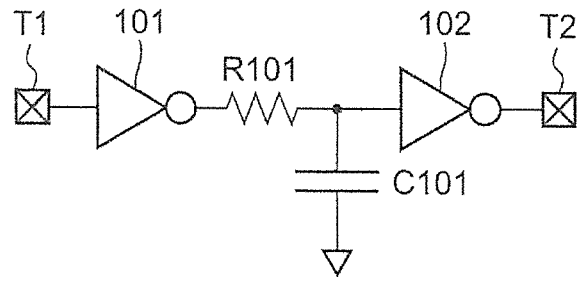
FIG. 4A is a circuit diagram showing the configuration of an RC delay circuit according to the conventional example.
Figure 4B:
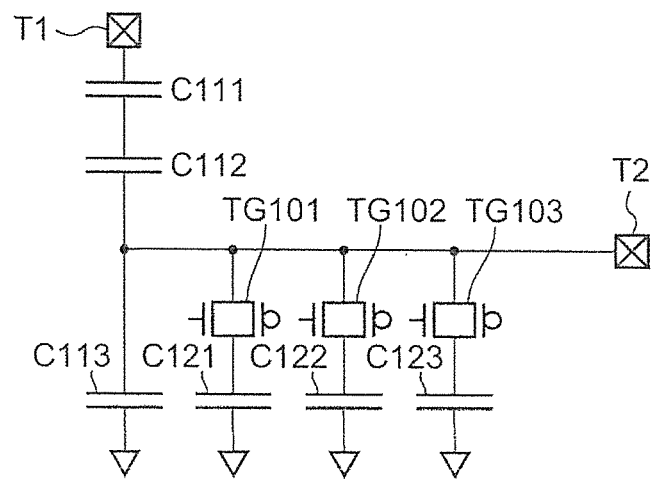
FIG. 4B is a circuit diagram showing the configuration of a voltage-divider capacitor circuit according to the conventional example.
Figure 4C:
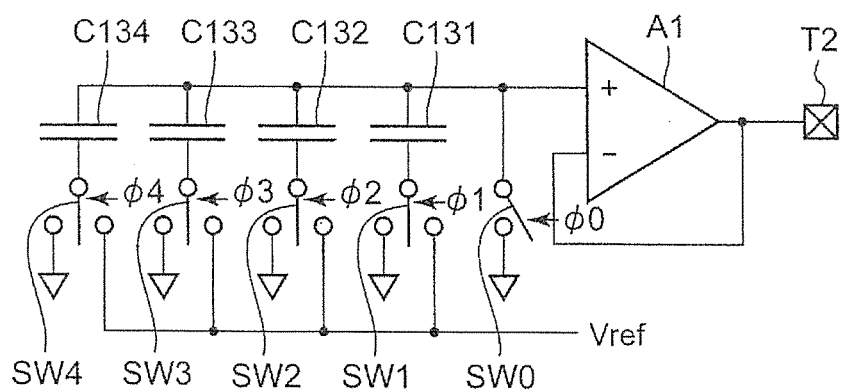
FIG. 4C is a circuit diagram showing the configuration of a charge transfer type DA converter according to the conventional example.

The present embodiment illustrates a basic method for adjusting a capacitance of a MOM capacitor. FIGS. 5A-5D are schematic diagrams showing vertical cross-sectional views of the first to the fourth processes for a method of manufacturing a MOM capacitor circuit according to the first embodiment of the invention. FIGS. 5A-5D show a plurality of metal electrodes M21~M45 formed at metal layers ML2~ML4 through an oxide film on a semiconductor substrate. The semiconductor substrate and the oxide film are not shown, and the same applies to the "schematic diagrams of the vertical cross-sectional views" described below. The specific manufacturing method is similar to that shown in FIGS. 3A and 3B, and N represents the row number of the forming position of the metal electrodes. Referring to FIGS. 5A-5D, the manufacturing method for reducing the overall capacitance of the capacitor circuit will be explained below.

Figure 5A:
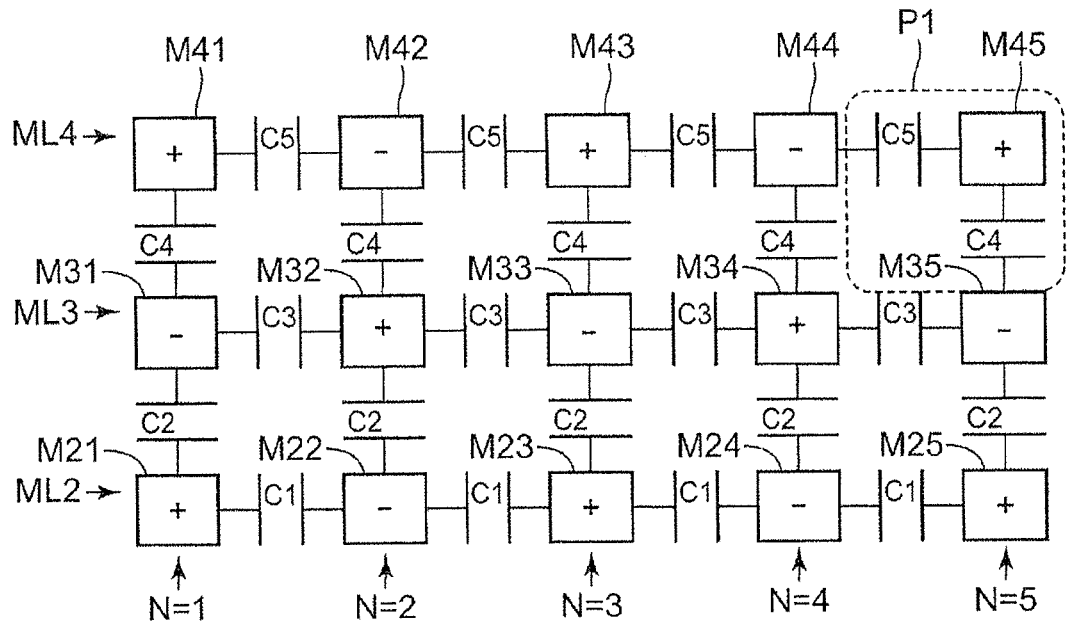
FIG. 5A is a schematic vertical cross-sectional view showing a first process for a method of manufacturing a MOM capacitor circuit according to a first embodiment of the invention.

In FIG. 5A showing a basic structure of a capacitor circuit, the metal electrodes M21~M25 are formed in a metal layer ML2, the metal electrode M31~M35 are formed in a metal layer ML3, and the metal electrodes M41~M45 are formed in a metal layer ML4. Regarding the capacitors in the horizontal direction, each of the capacitors C1 is formed between each adjacent pair of metal electrodes among the metal electrodes M21~M25 of the metal layer ML2; each of the capacitors C3 is formed between each adjacent pair of metal electrodes among the metal electrodes M31~M35 of the metal layer ML3; each of the capacitors C5 is formed between each adjacent pair of metal electrodes among the metal electrodes M41~M45 of the metal layer ML4. As for the capacitors in the vertical direction, a plurality of capacitors is formed as follows. In addition, the plurality of the metal electrodes M21~M45 are disposed in a position of the grid shape (matrix shape) shown in the cross-section of multiple layers on the semiconductor substrate.

(1) In row N=1, a capacitor C2 is formed by the pair of metal electrodes M21 and M31, and a capacitor C4 is formed by the pair of metal electrodes M31 and M41.

(2) In row N=2, a capacitor C2 is formed by the pair of metal electrodes M22 and M32, and a capacitor C4 is formed by the pair of metal electrodes M32 and M42.

(3) In row N=3, a capacitor C2 is formed by the pair of metal electrodes M23 and M33, and a capacitor C4 is formed by the pair of metal electrodes M33 and M43.

(4) In row N=4, a capacitor C2 is formed by the pair of metal electrodes M24 and M34, and a capacitor C4 is formed by the pair of metal electrodes M34 and M44.

(5) In row N=5, a capacitor C2 is formed by the pair of metal electrodes M25 and M35, and a capacitor C4 is formed by the pair of metal electrodes M35 and M45.

Figure 5B:
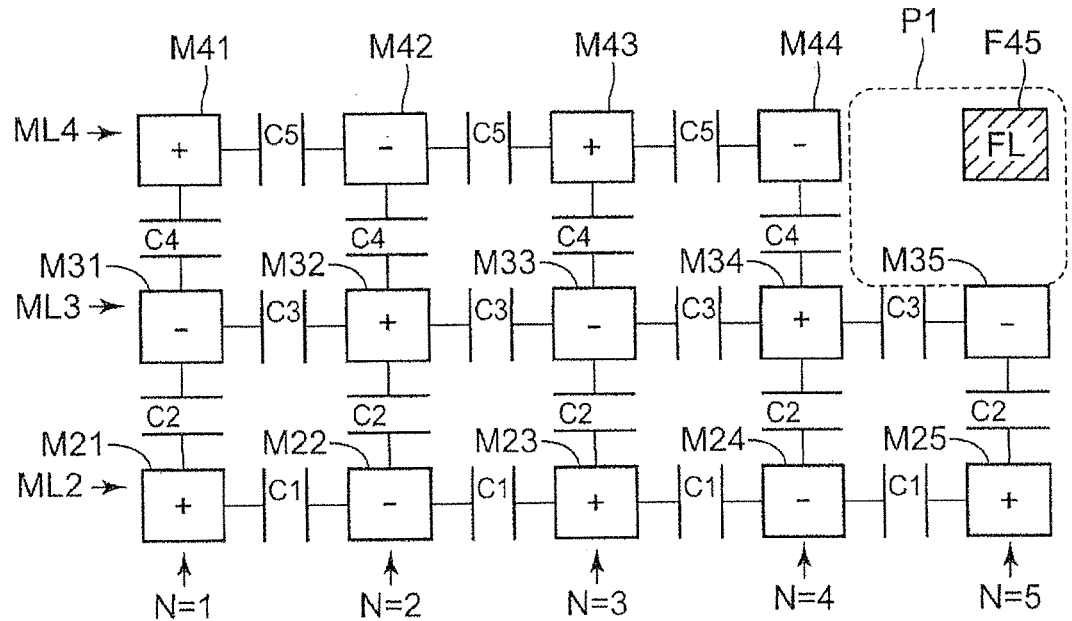
FIG. 5B is a schematic vertical cross-sectional view showing a second process for a method of manufacturing a MOM capacitor circuit according to a first embodiment of the invention.

As in the basic configuration of the capacitor circuit described above, in the circuit portion P1 that includes the metal electrode M45 and its surrounding capacitor C4 and C5, as shown in FIG. 5B, the metal electrode M45 is formed as a floating electrode F45 that is not connected to any of the electrodes, for example the same as a floating gate electrode of a flash memory. Here, the floating electrode F45 is in a floating state in the oxide film, which makes it possible to remove the capacitor C4 and C5 in the circuit portion P1. As such, the overall capacitance is recued by 8.7% as compared to the configuration shown in FIG. 5A. In addition, in FIG. 5B, a plurality of metal electrodes serving as the floating electrodes can be formed. For example, F26, F36 and F46 are formed as dummy electrodes for correctly maintaining the shape of the electrodes M21~M44 and F45.

Figure 5C:
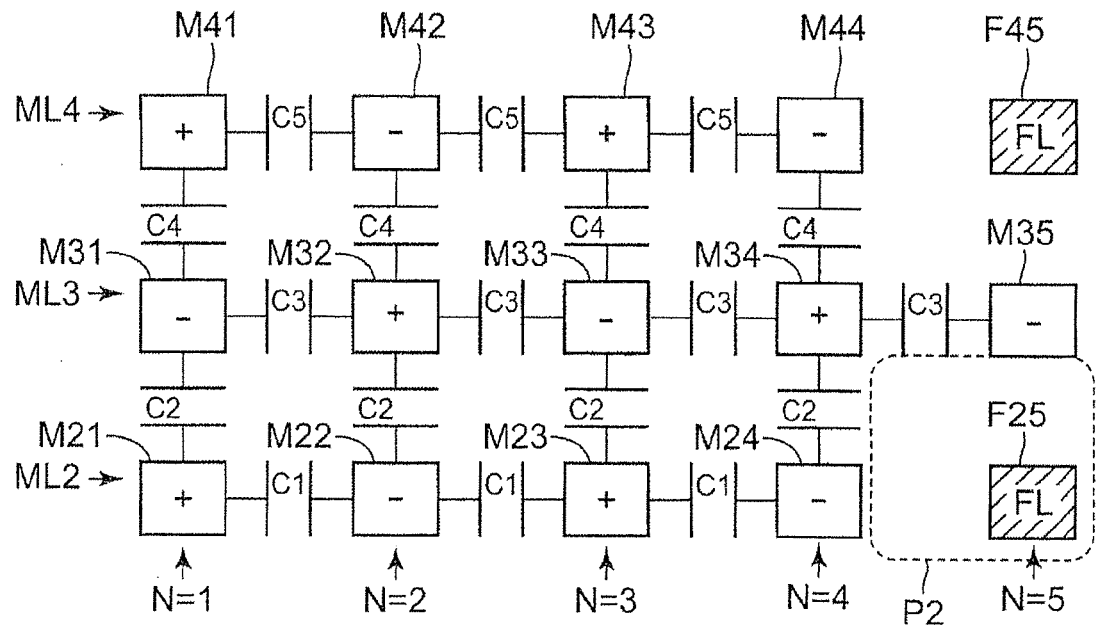
FIG. 5C is a schematic vertical cross-sectional view showing a third process for a method of manufacturing a MOM capacitor circuit according to a first embodiment of the invention.

Next, as shown in FIG. 5C, in the circuit portion P2 that includes the metal electrode M25 and its surrounding capacitor C1 and C2, the metal electrode M25 is formed as a floating electrode F25 that is not connected to any of the electrodes, for example the same as a floating gate electrode of a flash memory, etc. Here, the floating electrode F25 is in a floating state in the oxide film. In this manner, the capacitors C1 and C2 of the circuit portion P2 can be removed, and similarly the overall capacitance is recued by 8.7% as compared to FIG. 5B. In FIG. 5C, a plurality of the metal electrodes that becomes the floating electrodes can also be formed in multiple layers.

Figure 5D:
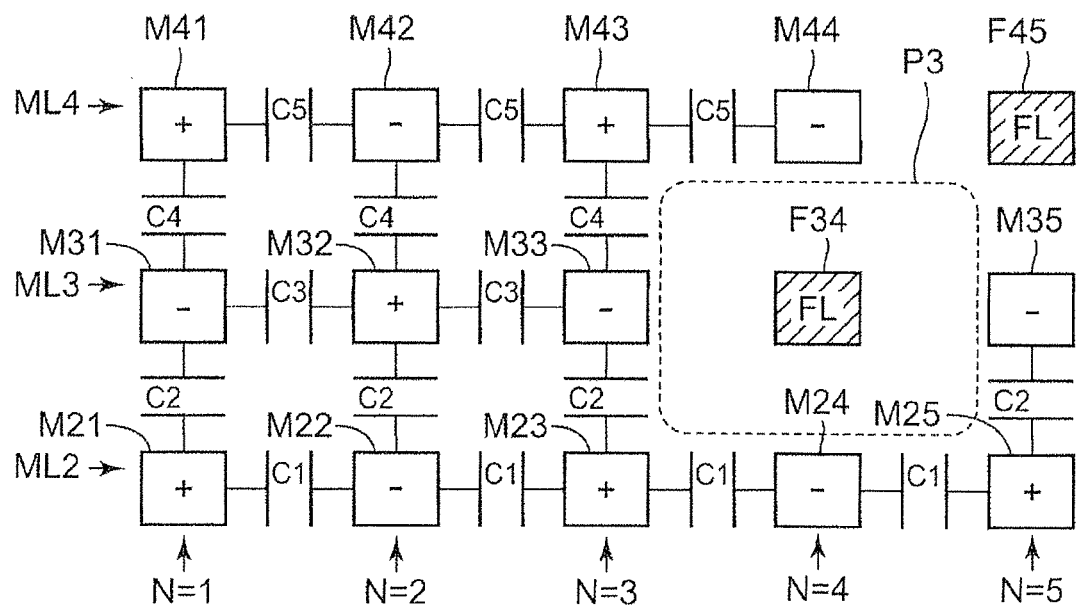
FIG. 5D is a schematic vertical cross-sectional view showing a fourth process for a method of manufacturing a MOM capacitor circuit according to a first embodiment of the invention.

Furthermore, from the configuration of FIG. 5B, and as shown in FIG. 5D, in the circuit portion P3 that includes the metal electrode M34 and its surrounding capacitor C2, C3, C3 and C4, the metal electrode M34 is formed as a floating electrode F34 that is not connected to any of the electrodes, for example the same as a floating gate electrode of a flash memory, etc. Here, the floating electrode F34 is in a floating state in the oxide film. In this manner, the capacitor C2, C3, C3 and C4 of the circuit portion P3 can be removed. By removing the capacitors in the capacitor circuit in FIG. 5D, the overall capacitance can be reduced by 8.7% as compared to the configuration shown in FIG. 5C.

Likewise, in FIG. 5D, a plurality of the metal electrodes that becomes the floating electrodes can also be formed in multiple layers.

As described above, according to the present embodiment, the manufacturing process is the same as the manufacturing process of a conventional flash memory, yet the capacitance of the plurality of capacitors formed on the semiconductor substrate can be easily reduced as compared with the conventional art. Each of the settings shown in FIGS. 5A-5D has reduced the capacitance by 8.7% respectively, and this reduction rate can be further decreased by increasing the number of layers or metal electrodes in each layers, and, it is possible to make a design to fulfil both the reduction rate and the overall capacitance by the combination with the length of the electrode.

To change the capacitance of the MOM capacitor circuit as shown in the first embodiment, the pattern forming mask for the metal electrodes needs to be modified, and such modification cannot be performed after the completion of the manufacturing process. Clearly, this is not practical. The embodiment below shows a method for adjusting the capacitance after the completion of the manufacturing process.

Embodiment 2

Figure 6A:
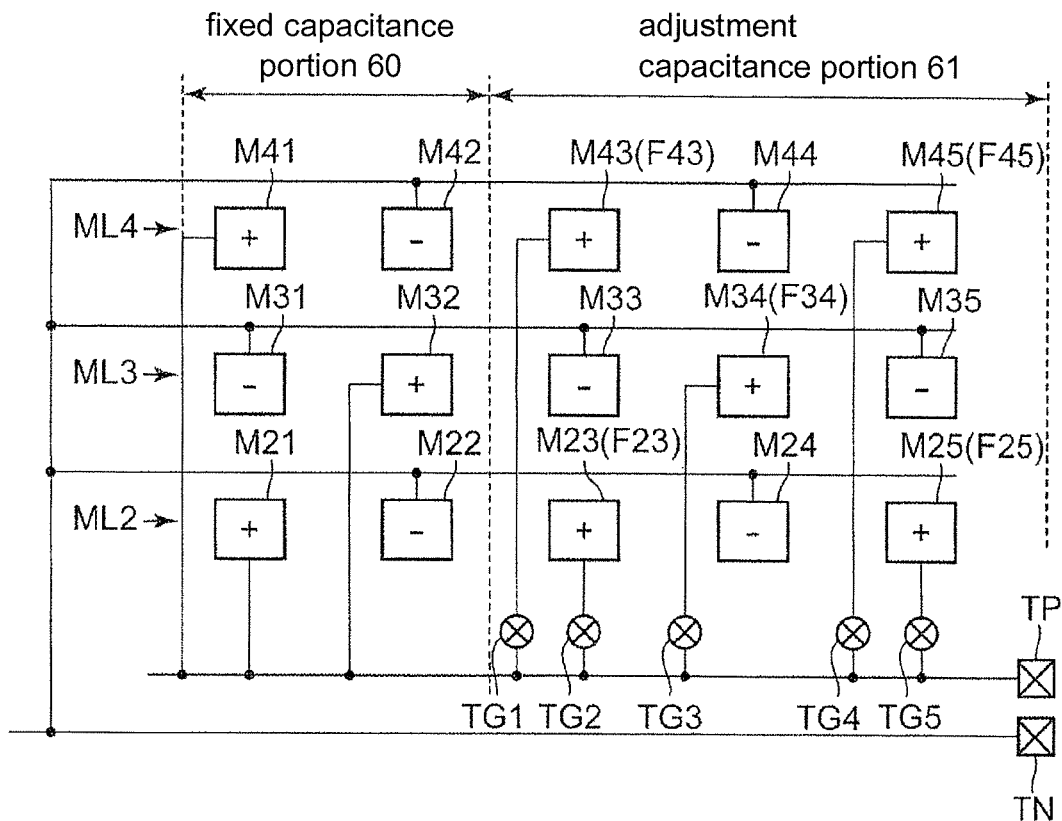
FIG. 6A is schematic vertical cross-sectional view showing a configuration of a MOM capacitor according to a second embodiment of the invention.
Figure 6B:
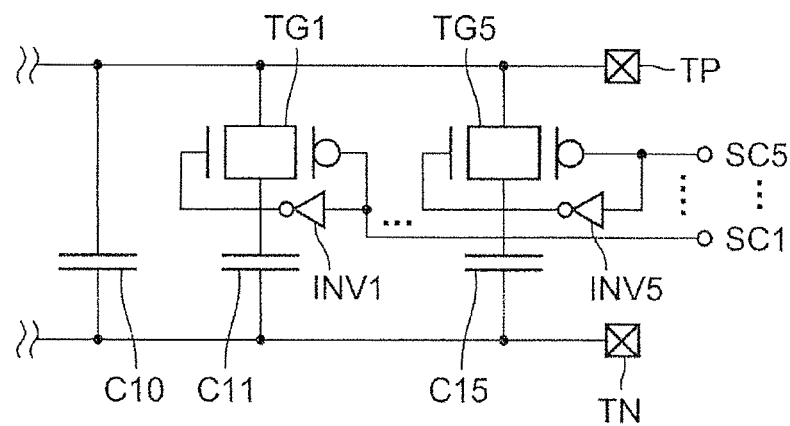
FIG. 6B is an equivalent circuit diagram of the MOM capacitor circuit shown in FIG. 6A.

FIG. 6A is a schematic cross-sectional view showing a configuration of a MOM capacitor according to a second embodiment of the invention. FIG. 6B is an equivalent circuit diagram of the MOM capacitor circuit shown in FIG. 6A. In FIG. 6A, the MOM capacitor circuit includes a fixed capacitance portion 60 with a fixed capacitance, and an adjustment capacitance portion 61 with an adjustable capacitance. In a metal layer ML2 of FIG. 6A, metal electrodes M21~M25 are formed. Here, the metal electrode M21 is connected to a positive electrode terminal TP through an internal metal line and the metal electrodes M22 and M24 are connected to a negative electrode terminal TN through an internal metal line. Further, the metal electrode M23 is connected to the positive electrode terminal TP through a transfer gate TG2, and the metal electrode M25 is connected to the positive electrode terminal TP through a transfer gate TG5.

In a metal layer ML3, metal electrodes M31~M35 are formed. Here, the metal electrodes M31, M33 and M35 are connected to the negative electrode terminal TN through an internal metal line, and the metal electrode M32 is connected to the positive electrode terminal TP through an internal metal line. Further, the metal electrode M34 is connected to the positive electrode terminal TP through a transfer gate TG3.

In a metal layer ML4, metal electrode M41~M45 are formed. Here, the metal electrode M41 is connected to the positive electrode terminal TP through an internal metal line, and the metal electrodes M42 and M44 are connected to the negative electrode terminal TN through an internal metal line. Further the metal electrode M43 is connected to the positive electrode terminal TP through a transfer gate TG1, and the metal electrode M45 is connected to the positive electrode terminal TP through a transfer gate TG4.

In addition, each of the transfer gates TG1~TG5 is for example connected in parallel with a P-channel MOS transistor and an N-channel MOS transistor, and are respectively a switch element that is turned on or off by a control signal.

In FIG. 6B, which shows an equivalent circuit diagram of the MOM capacitor circuit of FIG. 6A, the capacitor C10 is connected in between the positive electrode terminal TP and the negative electrode terminal TN, and the capacitor C11 is also connected through the transfer gate TG1. Similarly, the capacitor Cln is connected in between the positive electrode terminal TP and the negative electrode terminal TN through the transfer gate TGn (n=2, 3, 4, 5). Further, a control signal SC1 is inputted to an inverting input terminal of the transfer gate TG1, and is inputted to a non-inverting input terminal of the transfer gate TG1 through an inverter INV1. Similarly, the control signal SCn (n=2, 3, 4, 5) is inputted to an inverting input terminal of the transfer gate TGn, and is inputted to a non inverting input terminal of the transfer gate TGn through the inverter INVn (n=2, 3, 4, 5).

In the MOM capacitor circuit with the configuration as described above, an adjustment capacitance portion 61 is included. Therefore, the capacitance of the MOM capacitor can be adjusted as follows.

(1) When the transfer gate TG1 is turned off by the control signal SC1, the metal electrode M43 becomes a floating electrode F43, wherein the capacitance around the floating electrode F43 decreases.

(2) When the transfer gate TG2 is turned off by the control signal SC2, the metal electrode M23 becomes a floating electrode F23, wherein the capacitance around the floating electrode F23 decreases.

(3) When the transfer gate TG3 is turned off by the control signal SC3, the metal electrode M34 becomes a floating electrode F34, wherein the capacitance around the floating electrode F34 decreases.

(4) When the transfer gate TG4 is turned off by the control signal SC4, the metal electrode M45 becomes a floating electrode F45, wherein the capacitance around the floating electrode F45 decreases.

(5) When the transfer gate TG5 is turned off by the control signal SC5, the metal electrode M25 becomes a floating electrode F25, wherein the capacitance around the floating electrode F25 decreases.

In the described MOM capacitor circuit, each capacitor is formed by a pair of adjacent metal electrodes, and the pair of adjacent metal electrodes is respectively connected to the positive electrode terminal TP and the negative electrode terminal TN. In order to adjust the capacitance of all of the capacitors of the MOM capacitor circuit, the transfer gates TG1~TG5, i.e., switch elements are provided, and in the present embodiment, they are connected to the positive electrode terminal for capacitance adjustment. After adjusting the capacitance of all of the capacitors in the MOM capacitor circuit, the combination of the on or off state of each of the transfer gates TG1~TG5 is fixed. As such, the capacitance of all of the capacitors of the MOM capacitor circuit can be fixed.

In the adjustment test for the capacitance of the capacitor, it is difficult to measure the capacitance of each capacitor. Therefore, in an actual test, when changing the capacitance between the terminals TP and TN, the output of the circuit including the MOM capacitor circuit, i.e., the voltage, frequency or signal timing are measured.

As described above, according to the present embodiment, in the capacitor circuit formed by a plurality of capacitors using the metal electrodes formed on the semiconductor substrate 20, an adjustment capacitance portion 61 is provided, and by turning on or off the transfer gates TG1~TG5 (i.e., the switch elements), the capacitance of the capacitor can be adjusted with higher precision as compared to the conventional art.

Third Embodiment

Figure 7A:
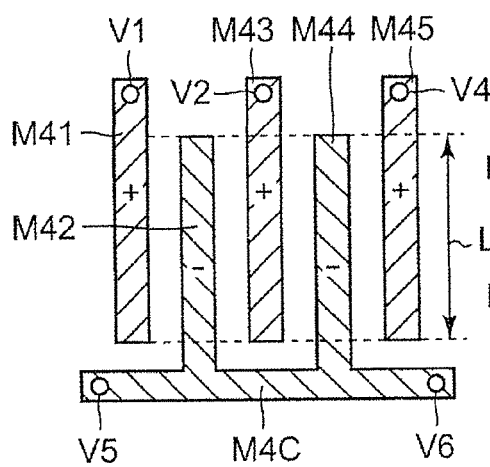
FIGS. 7A-7D are plan views showing a configuration of an MOM capacitor circuit according to a third embodiment of the invention.
Figure 7B:
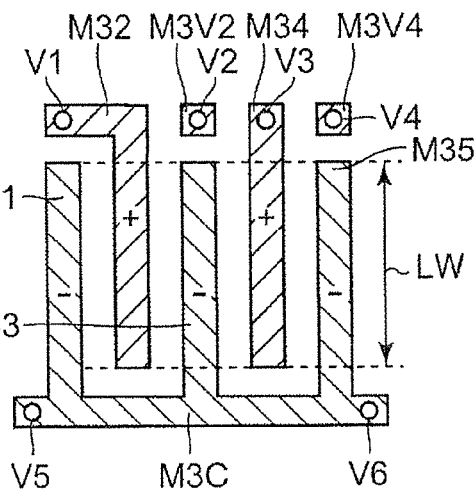
Figure 7C:
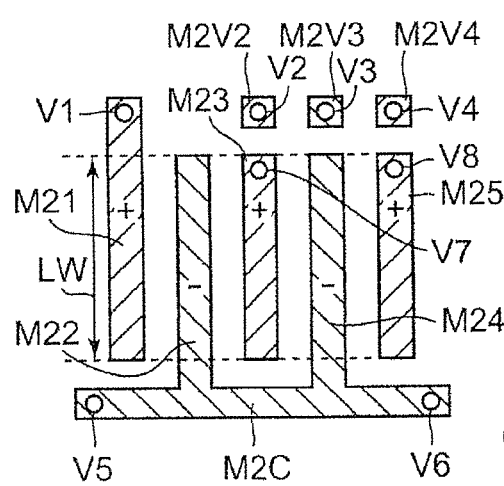
Figure 7D:
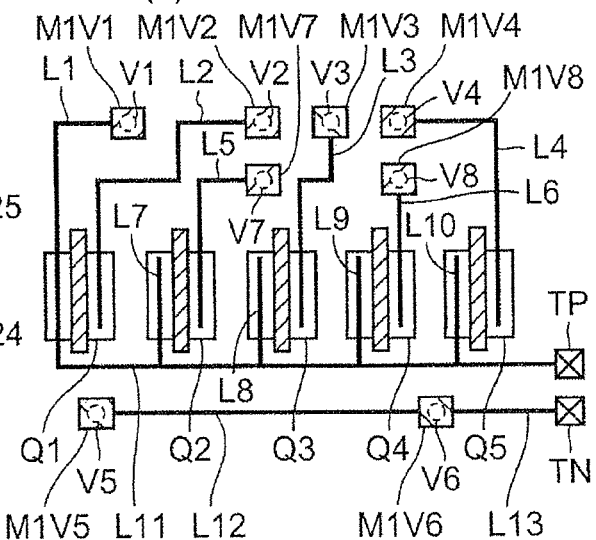

FIGS. 7A-7D are plan views showing a configuration of a MOM capacitor circuit according to a third embodiment of the invention, FIG. 7A is a plan view of a metal layer ML4, FIG. 7B is a plan view of a metal layer ML3, FIG. 7C is a plan view of a metal layer ML2 and FIG. 7D is a schematic plan view of a metal layer ML1 and MOS transistors Q1~Q5.

In the metal layer ML4 of FIG. 7A, metal electrodes M41~M45 and M4C are formed. Here, the metal electrodes M41, M43 and M45 have a strip shape with a predetermined width, and the metal electrodes M22, M44 and M4C are connected together to have a comb shape. A capacitor having a line length LW is respectively formed by a pair of the metal electrodes M41 and M42, a pair of the metal electrode M42 and M43, a pair of the metal electrodes M43 and M44, and a pair of the metal electrodes M44 and M45.

In the metal layer ML3 of FIG. 7B, metal electrodes M31~M35 and M3C, M3V2, M3V4 are forming. Here, the metal electrodes M32, M34 have a strip shape with a predetermined width, and the metal electrodes M31, M35 and M3C are connected together to have a comb shape. A capacitor having a line length LW is respectively formed by a pair of the metal electrodes M31 and M32, a pair of the metal electrodes M32 and M33, a pair of the metal electrodes M33 and M34 and a pair of the metal electrodes M34 and M35. Furthermore, in the same way, a capacitor having a line length LW is respectively formed by a pair of the metal electrodes M31 and M41, a pair of the metal electrodes M32 and M42, a pair of the metal electrodes M33 and M43 and a pair of the metal electrodes M34 and M44.

In the metal layer ML2, the metal electrodes M21~M25 and M2C, M2V2~M2V4 are formed. Here, the metal electrodes M21, M23 and M25 have a strip shape with a predetermined width, and the metal electrodes M22, M24 and M2C are connected together to have a comb shape. A capacitor having a line length LW is respectively formed by a pair of the metal electrodes M21 and M22, a pair of the metal electrodes M22 and M23, a pair of the metal electrodes M23 and M24 and a pair of the metal electrodes M24 and M25. Furthermore, in the same way, A capacitor having a line length LW is respectively formed by a pair of the metal electrodes M21 and M31, a pair of the metal electrodes M22 and M32, a pair of the metal electrodes M23 and M33, a pair of the metal electrodes M24 and M34 and a pair of the metal electrodes M25 and M35.

In addition, the line length LW of each capacitor is for example several tens of μm to several hundreds of μm. Furthermore, the metal electrodes M3V2, M3V4, M2V2, M2V3 and M2V4 are provided for contact holes V2, V3 and V4 that connect to the metal electrodes of the upper and lower layers.

In the metal layer ML1 and the MOS transistors Q1~Q5 of FIG. 7D, metal electrodes M1V1~M1V8 having a rectangular shape, connecting conductors L1~L13 and MOS transistors Q1~Q5 (i.e., switch elements) are formed.

Here, (1) the metal electrode M1V1 is connected to a positive electrode terminal TP through the connection conductor L1, the drain of the MOS transistor Q1 and the connection conductor L11.

(2) The metal electrode M1V2 is connected to the source of the MOS transistor Q1 through the connecting conductor L2.

(3) The metal electrode M1V3 is connected to the source of the MOS transistor Q3 through the connecting conductor L3.

(4) The metal electrode M1V4 is connected to the source of the MOS transistor Q5 through the connecting conductor L4.

(5) The metal electrode M1V7 is connected to the source of the MOS transistor Q2 through the connecting conductor L5.

(6) The metal electrode M1V8 is connected to the source of the MOS transistor Q4 through the connecting conductor L6.

(7) The drain of the MOS transistor Q2 is connected to the positive electrode terminal TP through the connecting conductors L7 and L11.

(8) The drain of the MOS transistor Q3 is connected to the positive electrode terminal TP through the connecting conductors L8 and L11.

(9) The drain of the MOS transistor Q4 is connected to the positive electrode terminal TP through the connecting conductors L9 and L11.

(10) The drain of the MOS transistor Q5 is connected to the positive electrode terminal TP through the connecting conductors L10 and L11.

(11) The metal electrodes M1V5 is connected to a negative electrode terminal TN through the connecting conductor L12, and the metal electrode M1V6 is connected to the negative electrode terminal TN through the connecting conductor L13.

The metal electrodes M1V1, M21, M32 and M41 are connected to each other through a via conductor that is formed in a via passing through along the thickness direction. The metal electrodes M1V2, M2V2, M3V2 and M43 are connected to each other through a via conductor that is formed in a via passing through along the thickness direction. The metal electrodes M1V3, M2V3 and M34 are connected to each other through a via conductor that is formed in a via passing through along the thickness direction. The metal electrodes M1V4, M2V4, M3V4 and M45 are connected to each other through a via conductor that is formed in a via passing through along the thickness direction. The metal electrodes M4C, M3C, M2C and M1V5 are connected to each other through a via conductor that is formed in a via passing through along the thickness direction. The metal electrodes M4C, M3C, M2C and M1V6 are connected to each other through a via conductor that is formed in a via passing through along the thickness direction. The metal electrodes M23 and M1V7 are connected to each other through a via conductor that is formed in a via passing through along the thickness direction. The metal electrodes M25 and M1V8 are connected to each other through a via conductor that is formed in a via passing through along the thickness direction.

The MOM capacitor circuit that is configured as described above corresponds to the MOM capacitor circuit according to the second embodiment. In such MOM capacitor circuit, the MOS transistor Q1~Q5, i.e., the switch elements (corresponding to one of the MOS transistors of the transfer gates in the other embodiments) are formed on a semiconductor substrate. The MOS transistors Q1~Q5 are turned on and off in response to a control signal that is respectively applied to the gate thereof. As such, the connection of the plurality of capacitors in the MOM capacitor circuit are turned on or off, and thus the capacitance of the entire MOM capacitor circuit can be adjusted.

Fourth Embodiment

Figure 8A:
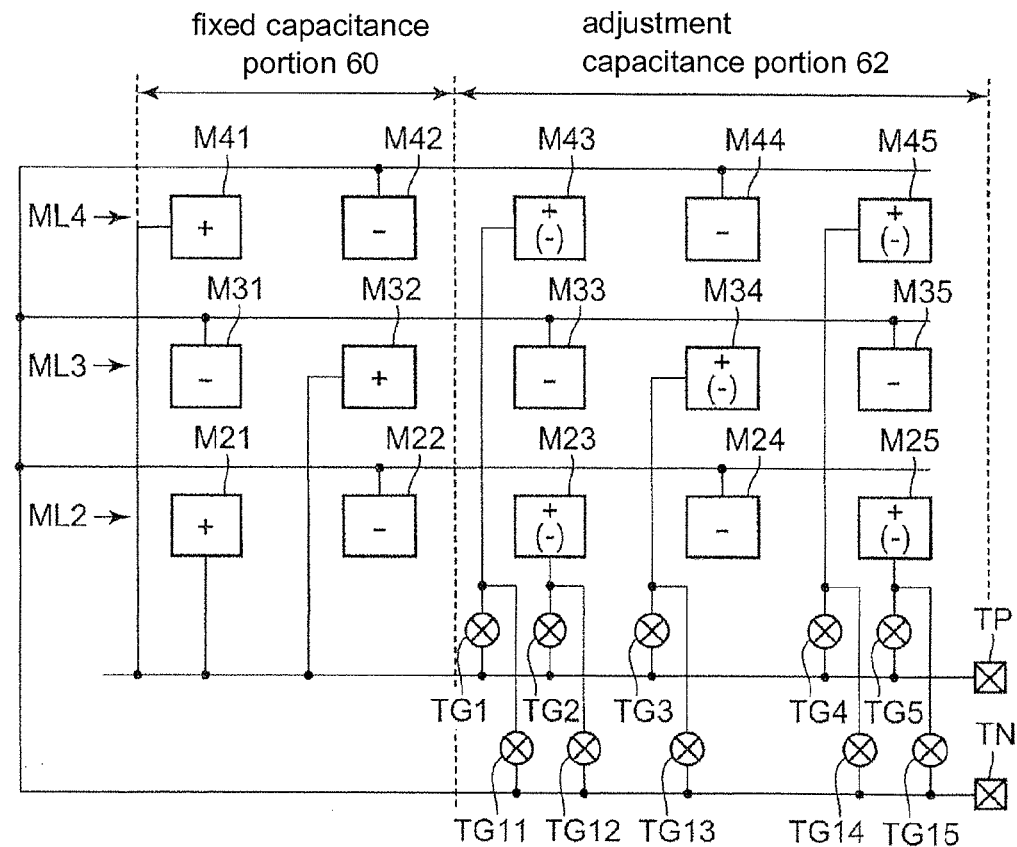
FIG. 8A is a schematic vertical cross-sectional view showing a configuration of a MOM capacitor circuit according to a fourth embodiment of the invention.
Figure 8B:
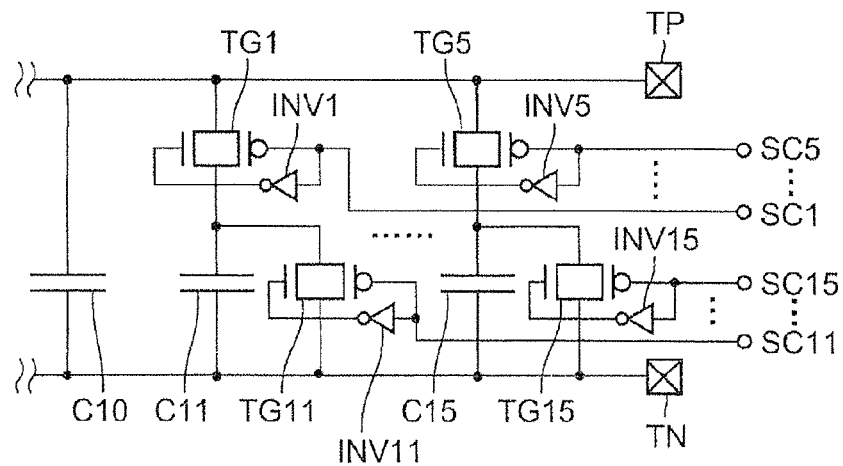
FIG. 8B is an equivalent circuit diagram of the MOM capacitor circuit shown in FIG. 8A.

FIG. 8A is a schematic vertical cross-sectional view showing a configuration of a MOM capacitor circuit according to a fourth embodiment of the invention. FIG. 8B is an equivalent circuit diagram of the MOM capacitor circuit shown in FIG. 8A. The MOM capacitor circuit according to the fourth embodiment of FIG. 8A differs from the MOM capacitor circuit according to the second embodiment of FIG. 6A as follows.

(1) An adjustment capacitance portion 62 is included to replace the adjustment capacitance portion 61.

(2) The adjustment capacitance portion 62 is constructed as follows.

(2-1) The metal electrode M43 is further connected to the negative electrode terminal TN through a transfer gate TG11.

(2-2) The metal electrode M23 is further connected to the negative electrode terminal TN through a transfer gate TG12.

(2-3) The metal electrode M34 is further connected to the negative electrode terminal TN through a transfer gate TG13.

(2-4) The metal electrode M45 is further connected to the negative electrode terminal TN through a transfer gate TG14.

(2-5) The metal electrode M25 is further connected to the negative electrode terminal TN through a transfer gate TG15.

Moreover, comparing the equivalent circuit diagram of FIG. 8B to the equivalent circuit diagram of FIG. 6B, the transfer gates TG11~15 are further prepared with inverters INV11~INV15 respectively.

In the adjustment capacitance portion 62 of FIG. 8A, when the transfer gate TG1 is turned on, the transfer gate TG11 is turned off, and when the transfer gate TG1 is turned off, the transfer gate TG11 is turned on. As such, the pair of transfer gates TG1 and TG11 are complementarily turned on or off from one another. Here, in the former situation, the capacitor C11 connected to the transfer gate TG1 is connected between the positive terminal electrode TP and the negative electrode terminal TN, so as to increase the capacitance of portion 62. However, in the latter situation, the two ends of the capacitor C11 connected to the transfer gate TG1 are shorted, so as to reduce the capacitance.

Similarly, a pair of the transfer gates TG2 and TG12, a pair of the transfer gates TG3 and TG13, a pair of the transfer gates TG4 and TG14 and a pair of the transfer gates TG5 and TG15 are complementarily turned on or off from one another. In addition, the correspondingly connected capacitors C12~C15 are connected between the positive electrode terminal TP and the negative electrode terminal TN to increase the capacitance of portion 62, or the two ends of the corresponding capacitors C12~C15 are shorted to reduce the capacitance.

In the adjustment capacitance portion 62 of the MOM capacitor circuit as configured above, each pair of transfer gates is complementarily turned on and off, so that the metal electrodes M43, M45, M34, M23, M25 are not in a floating state. Therefore, the capacitance of the entire MOM capacitor circuit can be increased or reduced, and be adjusted with high precision.

In addition, it is also possible to turn off each pair of the transfer gates simultaneously, so that the metal electrodes M43, M45, M34, M23 and M25 are in a floating state. Strictly speaking, since the whole capacitance when two terminals of the capacitor are shorted to the negative electrode terminal TN will be different from the capacitance when one terminal is in the floating state, such effect can also be utilized. In both situations, the capacitance component between diagonally adjacent metal electrodes in between adjacent layers can be observed, and there is a difference between the equivalent capacitance in the floating state or when in a state connected to the negative electrode TN. The capacitance component that becomes visible in series in a floating state will have an equivalent capacitance that is slightly smaller.

Fifth Embodiment

Figure 9:
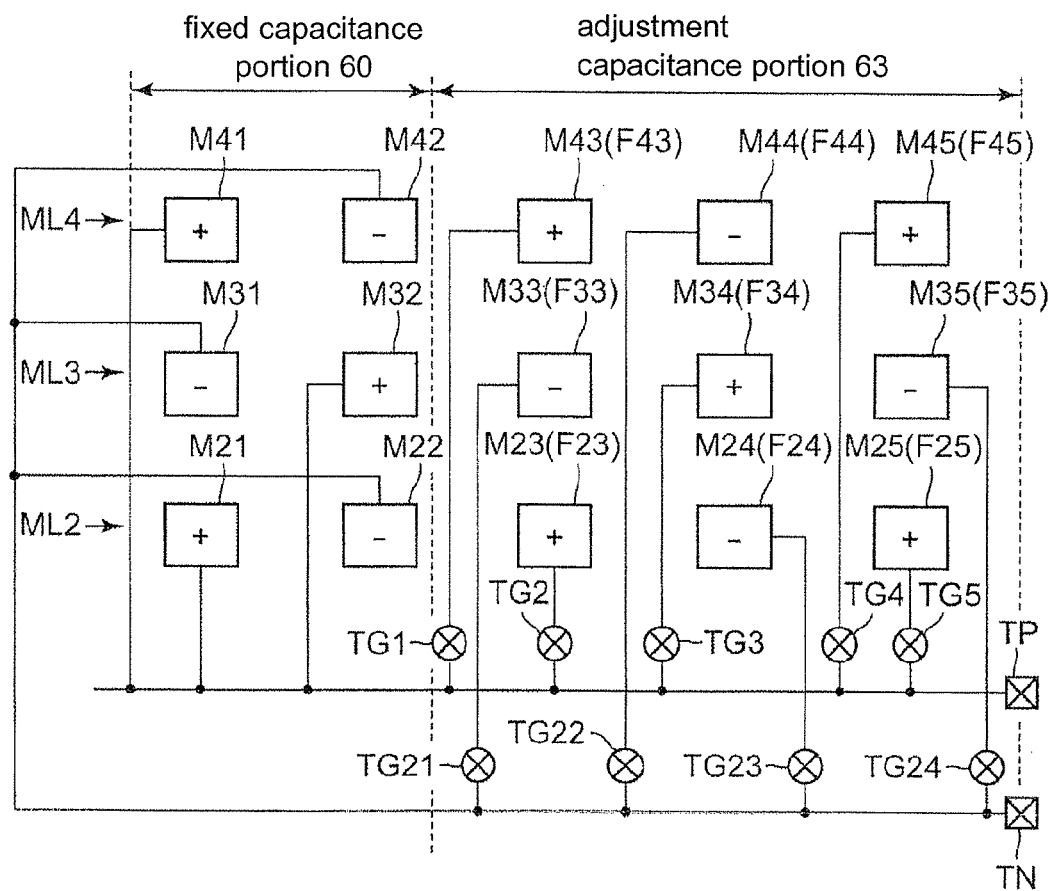
FIG. 9 is a schematic vertical cross-sectional view showing a configuration of a MOM capacitor circuit according to a fifth embodiment of the invention.

FIG. 9 is a schematic vertical cross-sectional view showing a configuration of a MOM capacitor circuit according to a fifth embodiment of the invention. The MOM capacitor circuit according to the fifth embodiment of FIG. 9 differs from the MOM capacitor circuit according to the second embodiment of FIG. 6A in following aspects.

(1) An adjustment capacitance portion 63 is included to replace the adjustment capacitance portion 61.

(2) The adjustment capacitance portion 63 is constructed as follows.

(2-1) The metal electrode 33 is not directly connected to the negative electrode terminal TN, but is connected to the negative electrode terminal TN through a transfer gate TG21.

(2-2) The metal electrode 44 is not directly connected to the negative electrode terminal TN, but is connected to the negative electrode terminal TN through a transfer gate TG22.

(2-3) The metal electrode 24 is not directly connected to the negative electrode terminal TN, but is connected to the negative electrode terminal TN through a transfer gate TG23.

(2-4) The metal electrode 35 is not directly connected to the negative electrode terminal TN, but is connected to the negative electrode terminal TN through a transfer gate TG24.

Here, in the adjustment capacitance portion 63, the adjustment of the capacitance of the MOM capacitor circuit utilizing the operation of the transfer gates TG1~TG5 is the same as the second embodiment.

(1) When the transfer gate TG21 is turned on, the metal electrode M33 becomes a negative electrode, whereas when the transmission gate TG21 is turned off, the metal electrode M33 becomes a floating electrode.

(2) When the transfer gate TG22 is turned on, the metal electrode M44 becomes a negative electrode, and when the transfer gate TG22 is turned off, the metal electrode M44 becomes a floating electrode.

(3) When the transfer gate TG23 is turned on, the metal electrode M24 becomes a negative electrode, and when the transfer gate TG23 is turned off, the metal electrode M24 becomes a floating electrode.

(4) When the transfer gate TG24 is turned on, the metal electrode M35 becomes a negative electrode, and when the transfer gate TG24 is turned off, the metal electrode M35 becomes a floating electrode.

When each of metal electrodes M33, M44, M24 and M35 becomes a negative electrode, the area between the positive electrode and said metal electrode increases, and therefore the capacitance of the MOM capacitor circuit increases. On the other hand, when each of metal electrodes M33, M44, M24 and M35 becomes floating, the area between the positive electrode and said metal electrode decreases, and therefore the capacitance of the MOM capacitor circuit reduces. As describe above, since the capacitance changes in the floating state and in the fixed voltage state, it is possible to more finely adjust the capacitance.

According to the adjustment capacitance portion 63 configured as above, based on whether or not to make the metal electrodes M43, M45, M34, M23 and M25 to be in the floating state by whether or not turning off the transfer gates TG1~TG5, and further based on whether or not to make the metal electrodes M33, M44, M24 and M35 to be in the floating state by whether or not turning off the transfer gates TG21~TG25, it is possible to increase or decrease the capacitance of the entire MOM capacitor circuit, and the capacitance of the entire MOM capacitor circuit can be adjusted with higher precision.

Sixth Embodiment

Figure 10:
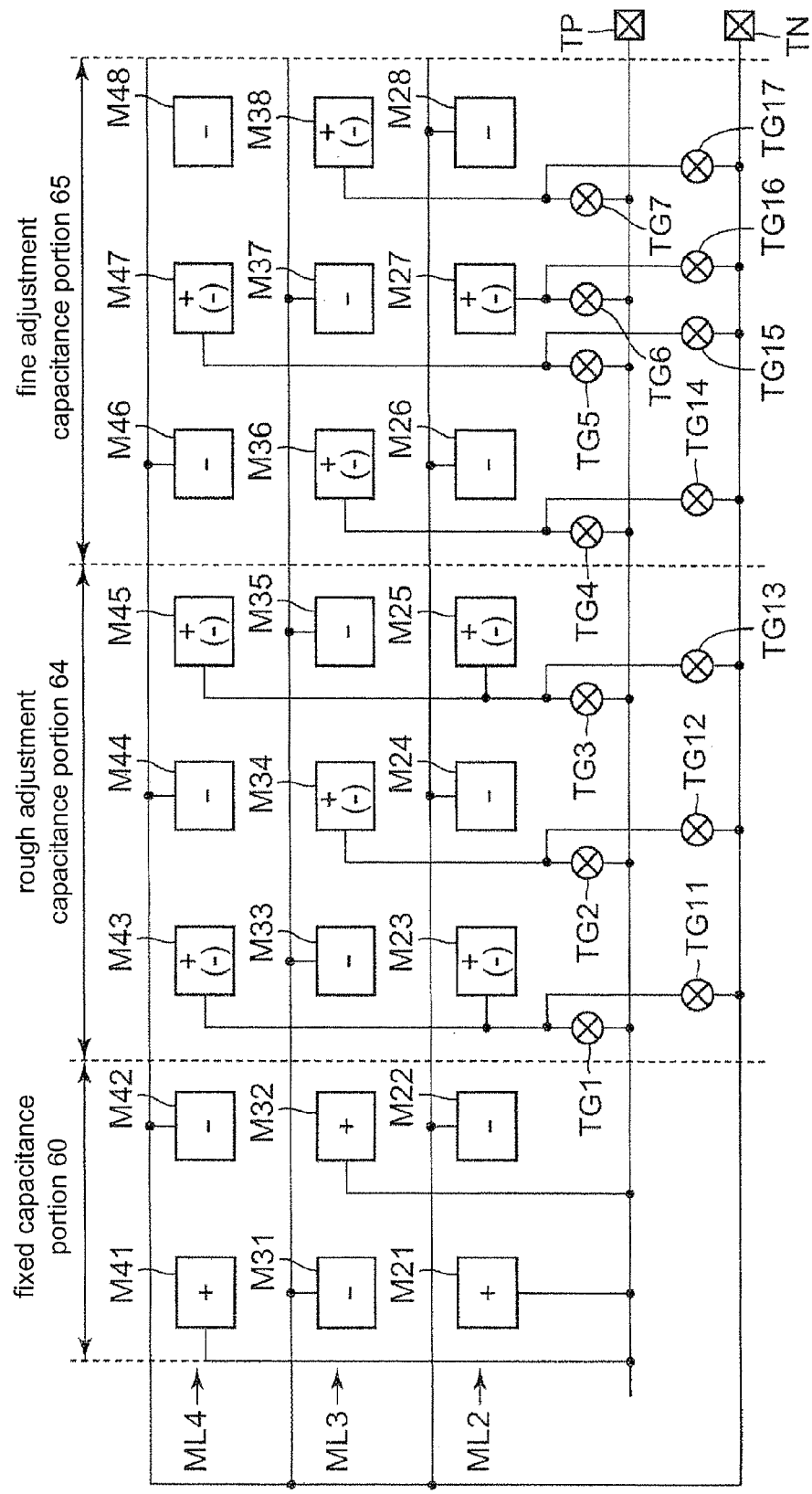
FIG. 10 is schematic vertical cross-sectional view showing a configuration of a MOM capacitor circuit according to a sixth embodiment of the invention.

FIG. 10 is schematic vertical cross-sectional view showing a configuration of a MOM capacitor circuit according to a sixth embodiment of the invention. In FIG. 10, the MOM capacitor circuit of the sixth embodiment is configured to include a fixed capacitance portion 60, a rough adjustment capacitance portion 64 and a fine adjustment capacitance portion 65.

In the fixed adjustment capacitance portion 60, the metal electrodes M41, M32 and M21 are connected to the positive electrode terminal TP, the metal electrodes M42, M31 and M22 are connected to the negative electrode terminal TN, and the entire capacitance of the fixed adjustment capacitance portion 60 has a predetermined fixed capacitance.

In the rough adjustment capacitance portion 64, the metal electrodes M44, M33, M35 and M24 are connected to the negative electrode terminal TN. The metal electrodes M43, M23 are connected to the positive electrode terminal TP through the transfer gate TG1, and connected to the negative electrode terminal TN through the transfer gate TG11. Further, the metal electrode M34 is connected to the positive electrode terminal TP through the transfer gate TG2, and connected to the negative electrode terminal TN through the transfer gate TG12. Moreover, the metal electrodes M45, M25 are connected to the positive electrode terminal TP through the transfer gate TG3, and connected to the negative electrode terminal TN through the transfer gate TG13. As such, by turning on one of, two of or three of the transfer gates TG1~TG3, the metal electrodes connected to the positive electrode terminal TP can be set to a positive electrode to generate a predetermined capacitance. On the other hand, by turning on at least one of, two of or three of the transfer gates TG11~TG13, the metal electrodes connected to the negative electrode terminal TN can be set to a negative electrode to generate a predetermined capacitance.

In the fine adjustment capacitance portion 65, the metal electrodes M46, M48, M37, M26 and M28 are connected to the negative electrode terminal TN. The metal electrode M36 is connected to the positive electrode terminal TP through the transfer gate TG4, and connected to the negative electrode terminal TN through the transfer gate TG14. The metal electrode M47 is connected to the positive electrode terminal TP through the transfer gate TG5, and connected to the negative electrode terminal TN through the transfer gate TG15. The metal electrode M27 is connected to the positive electrode terminal TP through the transfer gate TG6, and connected to the negative electrode terminal TN through the transfer gate TG16. The metal electrode M38 is connected to the positive electrode terminal TP through the transfer gate TG7, and connected to the negative electrode terminal TN through the transfer gate TG17. As such, by turning on one of, two of, three of, or four of the transfer gates TG4~TG7, the metal electrodes connected to the positive electrode terminal TP can be set to a positive electrode to generate a predetermined capacitance. On the other hand, by turning on one of, two of, three of, or four of the transfer gates TG14~TG17, the metal electrodes connected to the negative electrode terminal TN can be set to a negative electrode to generate a predetermined capacitance.

Comparing the configuration of the rough adjustment capacitance portion 64 with the fine adjustment capacitance portion 65, in the rough adjustment capacitance portion 64, the metal electrodes that are connected to each of the transfer gates TG1~TG3 or TG11~TG13 constitute the positive electrodes that are in a longitudinal direction in the same row. On the other hand, in the fine adjustment capacitance portion 65, the number of metal electrodes connected to each of the transfer gates TG4~TG7 or TG14~TG17 is one respectively. Therefore, regarding the change in the overall capacitance of the MOM capacitor circuit when each transfer gate is controlled to turn on or off, the rough adjustment capacitance portion 64 will have a greater change as compared to the fine adjustment capacitance portion 65. Therefore, the rough adjustment portion 64 can adjust the overall capacitance roughly, while the fine adjustment capacitance portion can adjust the overall capacitance finely.

In addition, in the rough adjustment capacitance portion 64, the number of metal electrodes connected to each of the transfer gates is two, however, this is not particularly limited in the present invention, and can be three or more. For example, when using 4 or more layers of the metal wiring layers, there is also a method for commonly connecting the metal electrodes in the lateral direction of the metal layer, rather than in the vertical direction, or mixing the above combinations is also possible.

MODIFIED EMBODIMENTS

In the above embodiments, a MOM capacitor circuit having a plurality of MOM (Metal-Oxide-Metal) capacitors is provided, wherein each MOM capacitor is forming by a pair of metal electrodes facing each other through an insulating film on a substrate, wherein the MOM capacitor circuit is formed by at least one capacitor element in a manner that the pair of the metal electrodes of each of the MOM capacitors is connected to a first terminal and a second terminal through a connecting conductor. However, the present invention is not limited thereto. For instance, it is also possible to form a MOM capacitor circuit comprising a plurality of capacitor elements.

In the above embodiments, the metal electrodes are formed on the semiconductor substrate 20 to form a plurality of capacitors. However, the present invention is not limited thereto, for instance, the metal electrodes may be formed on other substrates such as dielectric substrates etc. In addition, the insulating material between the metal electrodes has been described as an oxide film, but the present invention is not limited thereto. For instance, other insulating such as a nitride film etc. or dielectric material may be formed. Furthermore, material for an insulating film between the metal layers and material for an insulating film between the metal layers in a lateral direction may be different.

In the above embodiments, three metal layers formed on the semiconductor substrate 20 are used to from the capacitor. However, the present invention is not limited thereto. For instance, the capacitor can be formed by two or more of the metal layers.

In the above embodiments, for the adjustment capacitance portions 61~63, the rough adjustment capacitance portion 64 and the fine adjustment capacitance portion 65, all the metal electrodes belonging to each part are connected to the positive electrode terminal TP or the negative electrode terminal TN through the transfer gates. However, the present invention is not limited thereto. For instance, it can be that at least one part of the metal electrodes belonging to the adjustment capacitance portion 61~63, the rough adjustment capacitance portion 64 and the fine adjustment capacitance portion 65 are connected to the positive electrode terminal TP or the negative electrode terminal through the transfer gates.

In the above embodiments, a fixed capacitance portion 60 is included. However, the present invention is not limited thereto, and can be a configuration without such fixed capacitance portion 60.

As described above, according to the capacitor circuit of a semiconductor device in the present invention, in a capacitor circuit that a plurality of capacitors is formed by using metal electrodes formed on the substrate of the semiconductor device, the capacitance of the capacitor can be adjusted with higher precision as compared to the conventional art. The capacitor circuit of the semiconductor device of the present invention not only can be used in electronic devices such as panel computers or smart phones, but also can be widely applied to various semiconductor devices such as CPU, memory devices etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A MOM capacitor circuit comprising:
a plurality of MOM (Metal-Oxide-Metal) capacitors respectively formed by a plurality of pairs of metal electrodes facing each other through an insulating film on a substrate, wherein the MOM capacitor circuit is formed by at least one capacitor element in a manner that each of the pairs of the metal electrodes of the plurality of the MOM capacitors is connected to a first terminal and a second terminal through a connecting conductor;
one or more switch element, connected to the plurality of metal electrodes and at least one of the first terminal and the second terminal; and
an adjustment capacitance portion with a variable capacitance, wherein the adjustment capacitance portion has a plurality of first metal electrodes, and at least one part of the plurality of first metal electrode is connected to either the first terminal or the second terminal through each of the switch elements,
wherein a capacitance of the MOM capacitor circuit is adjusted by turning on or off the switch element.

2. The MOM capacitor circuit according to claim 1, wherein the plurality of metal electrodes is arranged in a grid shape in a cross section of multiple layers on the substrate.

3. The MOM capacitor circuit according to claim 1, further comprising: a fixed capacitance portion with a fixed capacitance, wherein the fixed capacitance portion has a plurality of second metal electrodes, and the plurality of the second metal electrodes is respectively connected to either the first terminal or the second terminal.

4. The MOM capacitor circuit according to claim 1, wherein at least one part of the plurality of the first metal electrodes of the adjustment capacitance portion is connected to the first terminal through each of the switch elements.

5. The MOM capacitor circuit according to claim 4, wherein when each of the switch elements is turned off, a metal electrode connected to each of the switch elements is in a floating state.

6. The MOM capacitor circuit according to claim 1, wherein at least one part of the plurality of the first metal electrodes of the adjustment capacitance portion is connected to the first terminal through a first switch element and connected to the second terminal through a second switch element.

7. The MOM capacitor circuit according to claim 6, wherein when both of the first switch element and the second switch element are turned off, metal electrodes connected to the first switch element and the second switch element are in a floating state.

8. The MOM capacitor circuit according to claim 1, wherein at least one part of the plurality of the first metal electrodes of the adjustment capacitance portion is connected to the first terminal through a first switch element; and
at least another part other than the at least one part of the plurality of the first metal electrodes of the adjustment capacitance portion is connected to the second terminal through a second switch element.

9. The MOM capacitor circuit according to claim 8, wherein when the first switch element or the second switch element is turned off, a metal electrode connected to the first switch element or the second switch element is in a floating state.

10. The MOM capacitor circuit according to claim 1, wherein the adjustment capacitance portion comprises:
a rough adjustment capacitance portion, wherein a plurality of metal electrodes that belongs to the at least one part of the plurality of first metal electrode of the adjustment capacitance portion is connected to one another, and connected to the first terminal through a first switch element and connected to the second terminal through a second switch element; and
a fine adjustment capacitance portion, wherein metal electrodes other than the at least one part of the plurality of the first metal electrodes of the adjustment capacitance portion are respectively connected to the first terminal through a third switch element and connected to the second terminal through a fourth switch element.

11. The MOM capacitor circuit according to claim 10, wherein when both of the first switch element and the second switch element are turned off, metal electrodes connected to the first switch element and the second switch element are in a floating state.

12. A semiconductor device, comprising:
a MOM capacitor circuit, comprising:
a plurality of MOM (Metal-Oxide-Metal) capacitors respectively formed by a plurality of pairs of metal electrodes facing each other through an insulating film on a substrate, wherein the MOM capacitor circuit is formed by at least one capacitor element in a manner that each of the pairs of the metal electrodes of the plurality of the MOM capacitors is connected to a first terminal and a second terminal through a connecting conductor;
one or more switch element, connected to the plurality of metal electrodes and at least one of the first terminal and the second terminal; and
an adjustment capacitance portion with a variable capacitance, wherein the adjustment capacitance portion has a plurality of first metal electrodes, and at least one part of the plurality of first metal electrode is connected to either the first terminal or the second terminal through each of the switch elements,
wherein a capacitance of the MOM capacitor circuit is adjusted by turning on or off the switch element, and
wherein the plurality of metal electrodes is arranged in a grid shape in a cross section of multiple layers on the substrate.

13. The semiconductor device according to claim 12, further comprising: a fixed capacitance portion with a fixed capacitance, wherein the fixed capacitance portion has a plurality of second metal electrodes, and the plurality of the second metal electrodes is respectively connected to either the first terminal or the second terminal.

14. The semiconductor device according to claim 12, wherein at least one part of the plurality of the first metal electrodes of the adjustment capacitance portion is connected to the first terminal through each of the switch elements.

15. The semiconductor device according to claim 12, wherein at least one part of the plurality of the first metal electrodes of the adjustment capacitance portion is connected to the first terminal through a first switch element and connected to the second terminal through a second switch element.

16. The semiconductor device according to claim 12, wherein at least one part of the plurality of the first metal electrodes of the adjustment capacitance portion is connected to the first terminal through a first switch element; and
at least another part other than the at least one part of the plurality of the first metal electrodes of the adjustment capacitance portion is connected to the second terminal through a second switch element.

17. The semiconductor device according to claim 12, wherein the adjustment capacitance portion comprises:
a rough adjustment capacitance portion, wherein a plurality of metal electrodes that belongs to the at least one part of the plurality of first metal electrode of the adjustment capacitance portion is connected to one another, and connected to the first terminal through a first switch element and connected to the second terminal through a second switch element; and
a fine adjustment capacitance portion, wherein metal electrodes other than the at least one part of the plurality of the first metal electrodes of the adjustment capacitance portion are respectively connected to the first terminal through a third switch element and connected to the second terminal through a fourth switch element.

* * * * *